US010199401B2

(12) United States Patent
Leng

(10) Patent No.: US 10,199,401 B2
(45) Date of Patent: Feb. 5, 2019

(54) ARRAY SUBSTRATE AND METHOD FOR MAINTAINING THE SAME, DISPLAY PANEL AND DISPLAY DEVICE

(71) Applicants: Boe Technology Group Co., Ltd., Beijing (CN); Hefei Xinsheng Optoelectronics Technology Co., Ltd., Anhui (CN)

(72) Inventor: Hao Leng, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 29 days.

(21) Appl. No.: 15/503,076

(22) PCT Filed: Sep. 14, 2016

(86) PCT No.: PCT/CN2016/099017
§ 371 (c)(1),
(2) Date: Feb. 10, 2017

(87) PCT Pub. No.: WO2017/118088
PCT Pub. Date: Jul. 13, 2017

(65) Prior Publication Data
US 2018/0114797 A1    Apr. 26, 2018

(30) Foreign Application Priority Data
Jan. 4, 2016    (CN) .......................... 2016 1 0003928

(51) Int. Cl.
H01L 27/12    (2006.01)
G02F 1/1362    (2006.01)

(52) U.S. Cl.
CPC .... H01L 27/1244 (2013.01); G02F 1/136286 (2013.01); H01L 27/12 (2013.01);
(Continued)

(58) Field of Classification Search
None
See application file for complete search history.

(56) References Cited

U.S. PATENT DOCUMENTS 6,552,707 B1    4/2003  Fujiyoshi
2001/0015715 A1*  8/2001  Hebiguchi .......... G09G 3/3648
                                                  345/92
2012/0092321 A1    4/2012  Lin et al.

FOREIGN PATENT DOCUMENTS

CN    101852956    10/2010
CN    102004361    4/2011
(Continued)

OTHER PUBLICATIONS

International Search Report for PCT/CN2016/099017 dated Nov. 25, 2016.

Primary Examiner — Jay C Chang
(74) Attorney, Agent, or Firm — Calfee, Halter & Griswold LLP

(57) ABSTRACT

An array substrate includes a pixel unit, a data line, a first gate line and a second gate line. Adjacent two columns of pixel units are collectively connected to one data line, adjacent two of the pixel units in each row of pixel units are respectively connected to the first and second gate lines, the pixel unit includes a transistor, and the transistor in each pixel unit is provided adjacent to the data line. In adjacent two columns of pixel units, transistors of two diagonally adjacent pixel units are provided adjacent to the data line and connected respectively to the first and second gate lines. The first and second gate lines surround the gate electrode of the transistor, respectively, and the first and second gate lines are
(Continued)

connected to the gate electrode of the transistor at positions of the gate electrode away from the data line.

11 Claims, 5 Drawing Sheets

(52) U.S. Cl.
 CPC .... *G02F 1/13624* (2013.01); *G02F 1/136259* (2013.01); *G02F 2001/136263* (2013.01)

(56) References Cited

FOREIGN PATENT DOCUMENTS

| | | |
|---|---|---|
| CN | 102707450 | 10/2012 |
| CN | 103984174 | 8/2014 |
| CN | 203811954 | 9/2014 |
| CN | 105446038 | 3/2016 |

\* cited by examiner

ARRAY SUBSTRATE AND METHOD FOR MAINTAINING THE SAME, DISPLAY PANEL AND DISPLAY DEVICE

CROSS REFERENCE TO RELATED APPLICATIONS

The present application is a US national phase of PCT Application No. PCT/CN2016/099017, filed on Sep. 14, 2016, which is based upon and claims priority to Chinese Patent Application No. 201610003928.4, filed on Jan. 4, 2016, and the entire contents thereof are incorporated herein by reference.

TECHNICAL FIELD

The present disclosure relates to the field of display technology, in particular, to an array substrate and a method for maintaining the array substrate, a display panel and a display device.

BACKGROUND

Liquid display devices have been drawn more and more attention because they are small in volume and light in weight.

Generally, a liquid display device is formed by coupling an array substrate and a color film substrate. Generally, the array substrate involves a dual-gate design. As illustrated in FIG. 1, for example, each row of pixel units 1 on the array substrate is correspondingly connected to two gate lines 7, and the two gate lines 7 are respectively connected to the pixel units 1 in the odd columns and the pixel units 1 in the even columns of the row of pixel units 1. Compared with typical single-gate design (i.e., each row of pixel units is correspondingly connected to one gate line), a voltage linearity feature with greater range may be obtained by using the dual-gate design. Accordingly, it is possible to better control the problem of image quality degradation due to asymmetrical electrical signals, thereby presenting images with higher quality.

It should be noted that, information disclosed in the above background portion is provided only for better understanding of the background of the present disclosure, and thus it may contain information that does not form the prior art known by those ordinary skilled in the art.

SUMMARY

A distance between the two gate lines 7 is very close due to the substantive particularity of the dual-gate design product, and thus compared to the single-gate product, the possibility of occurrence of a defect such as a short circuit between adjacent two gate lines 7 or between gate electrodes 111 of adjacent two transistors 11 is greatly increased.

As illustrated in FIG. 2, each gate line 7 and the gate electrodes 111 of each row of transistors 11 are arranged across the row direction of the pixel units 1. In the case where a short circuit between the adjacent two gate lines 7 or between gate electrodes 111 of adjacent two transistors 11 occurs in a region other than the crossed region of the data line 2 and the gate line 7, it may be resolved by directly cutting off the position where the short circuit between the gate lines 7 or the gate electrodes 111 occurs, regardless of the position of the short circuit being in the gate electrode layer, the source/drain electrode layer or the uppermost insulation layer. However, in the case where the short circuit occurs in the crossed region of the data line 2 and the gate line 7, the data line 2 would have been cut off together while cutting off the position where the short circuit between the gate lines 7 or the gate electrodes 111 occurs, since the finished data line 2 passes over the region where the short circuit occurs. Meanwhile, in this case, it is impossible to maintain such a short circuit in the source/drain electrode layer, and it is relatively complex to maintain such a short circuit in the uppermost insulation layer. That is, in order to drive the entire gate line 7 normally, it is required to remove the gate line 7 at the short-circuiting position and bridge the gate line 7 at the cut-off position, resulting in a long maintenance time and low work efficiency.

Accordingly, it plays a crucial role in the product quality to optimize the circuit layout of the dual-gate array substrate, improve the maintenance success rate of the defects in the dual-gate array substrate, and minimize the impact on the circuit while maintaining the defects.

Embodiments of the present disclosure provide an array substrate and a method for maintaining the same, a display panel and a display device.

One aspect of the present disclosure provides an array substrate, including a plurality of pixel units arranged in an array, a plurality of data lines arranged in columns, and a plurality of first gate lines and second gate lines arranged in rows. Adjacent two columns of the pixel units are collectively connected to one of the data line. The data line is positioned between the adjacent two columns of the pixel units collectively connected to the data line. In each row of the pixel units, any adjacent two of the pixel units are connected to the first gate line and the second gate line, respectively, and the first gate line and the second gate line are disposed at an upper side and a lower side of the row of pixel units, respectively. Each of the pixel units includes a transistor and a pixel electrode, and the transistor in each of the pixel units is disposed adjacent to the data line to which the pixel unit is connected; among the pixel units collectively connected to one of the data lines and positioned in adjacent two rows, the transistors of two pixel units respectively connected to the first gate line and the second gate line between the adjacent two rows of the pixel units are disposed diagonally, and at a position of the diagonally disposed transistors, each of the first gate line and the second gate line respectively surrounds gate electrodes of the transistors of the pixel units connected thereto, and the first gate line and the second gate line are connected to the gate electrodes of the transistor respectively at a position of the gate electrode away from the data line to which the transistors are connected.

Another aspect of the present disclosure provides an array substrate, including a first gate line and a second gate line adjacent to each other, extending in a first direction, and the first gate line being positioned above the second gate line in a second direction perpendicular to the first direction. A first pixel unit is positioned above the first gate line in the second direction and connected to the first gate line. A second pixel unit is positioned below the second gate line in the second direction and connected to the second gate line, and the first pixel unit and the second pixel unit being disposed diagonally. A data line extends in the second direction and is positioned between the first pixel unit and the second pixel unit, the first pixel unit and the second pixel unit being collectively connected to the data line. The first pixel unit includes a first transistor and a first pixel electrode, and the second pixel unit includes a second transistor and a second pixel electrode, and the first transistor and the second transistor are disposed adjacent to the data line. The first and second transistors are respectively connected to the first gate line and the second gate line and are disposed diagonally, and at a position of the diagonally disposed transistors, the first gate line surrounds the a gate electrode of the first transistor and is connected to the first gate electrode at a position of the first gate electrode away from the data line, and the second gate line surrounds a second gate electrode of the second transistor and is connected to the second gate electrode at a position of the second gate electrode away from the data line.

Another aspect of the present disclosure provides a display panel including the above array substrate.

Another aspect of the present disclosure provides a display device including the above display panel.

Another aspect of the present disclosure provides a method for maintaining the above array substrate, including: when a short circuit occurs between gate electrodes of the transistors that are disposed diagonally, cutting off the connection between the first gate line and the gate electrode of the transistor, cutting off the connection between the second gate line and the gate electrode of the transistor, or cutting off both the connection between the first gate line and the gate electrode of the transistor and the connection between the second gate line and the gate electrode of the transistor.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

DETAILED DESCRIPTION

Hereinafter, the array substrate and the method for maintaining the array substrate, the display panel and the display device according to the present disclosure will be described in further detail with reference to the accompanying drawings and particular embodiments of the present disclosure, such that those skilled in the art may have a better understanding of technical solutions of the present disclosure.

Figure 1:
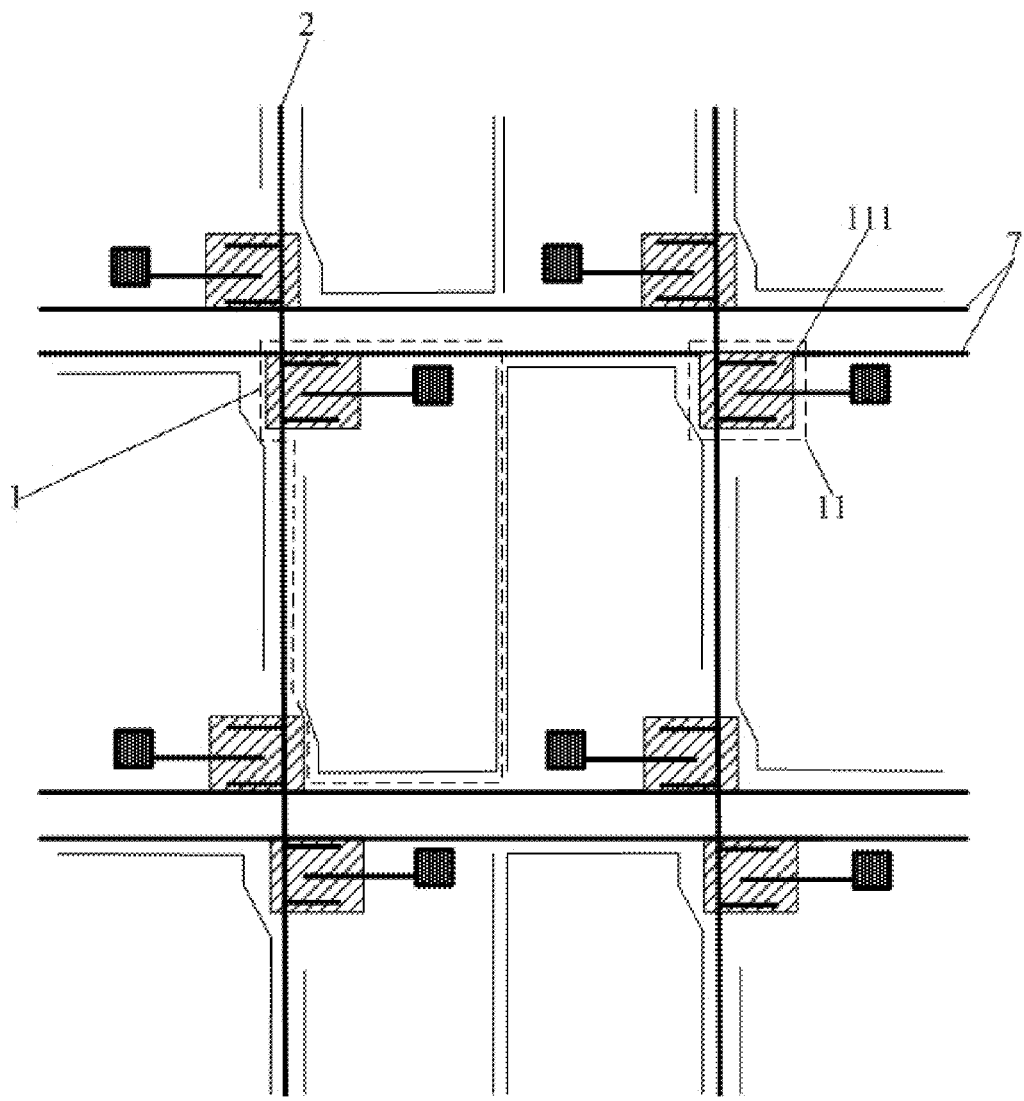
FIG. 1 is a schematic plan view of a structure of an array substrate according to the prior art.
Figure 2:
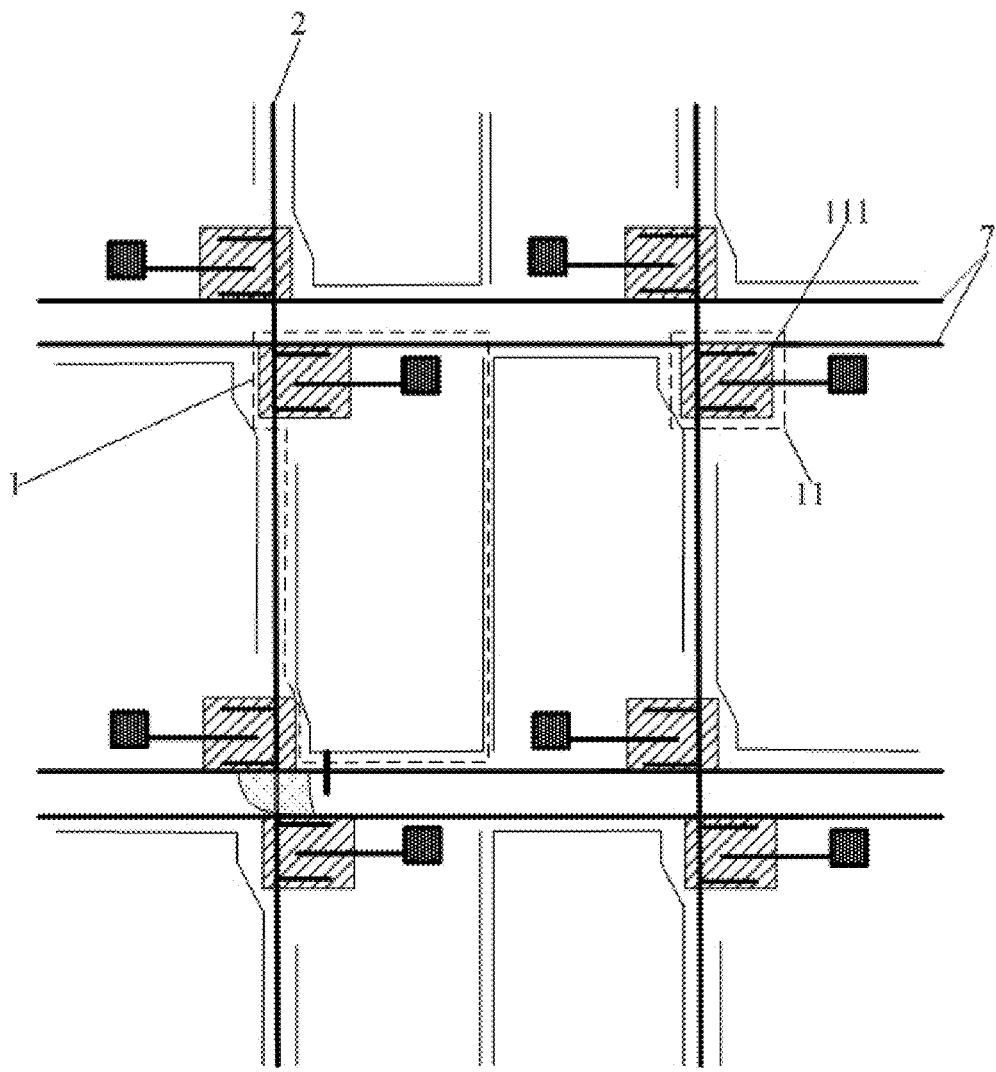
FIG. 2 is a schematic diagram illustrating a cutting off position when a short circuit occurs between gate electrodes of the transistors of two diagonally adjacent pixel units in the array substrate illustrated in FIG. 1.
Figure 3:
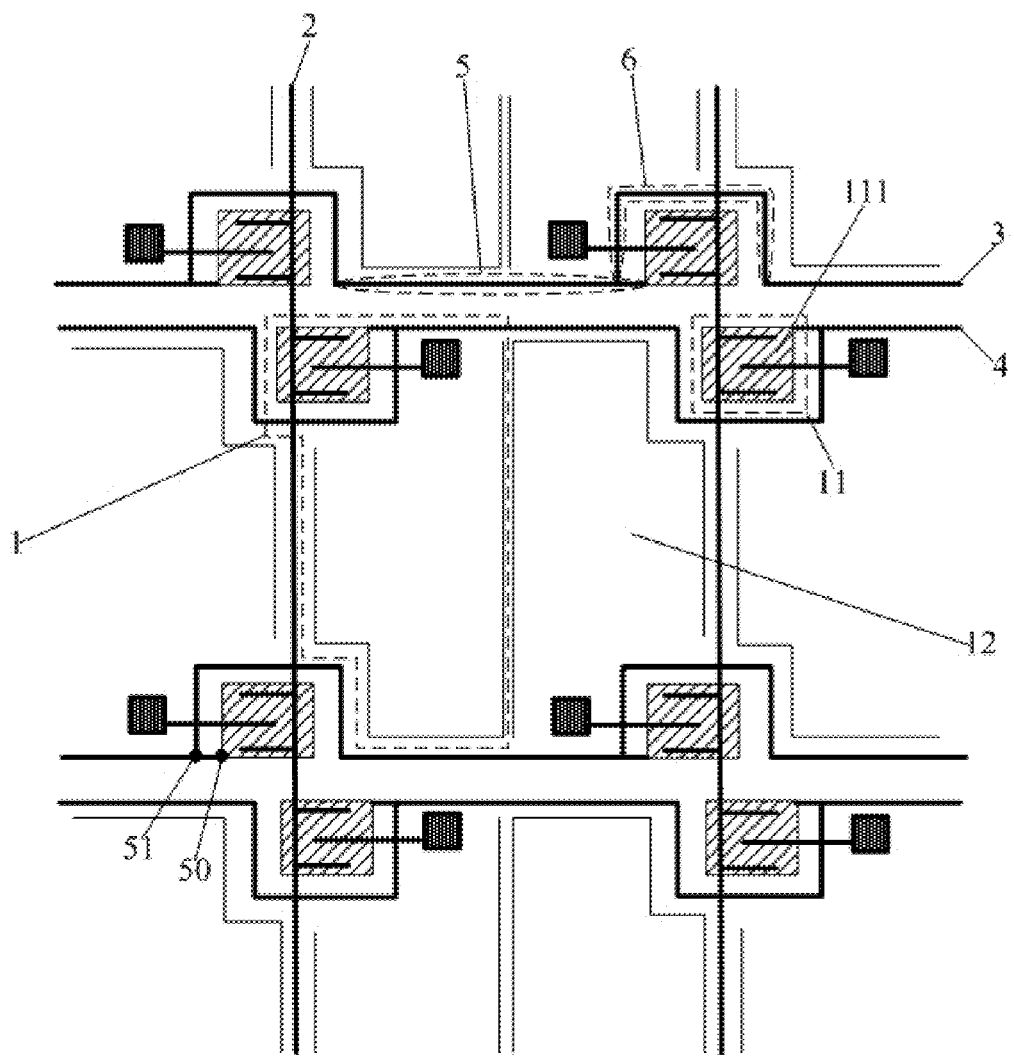
FIG. 3 is a schematic plan view of a structure of an array substrate according to an embodiment of the present disclosure.

Embodiments of the present disclosure provide an array substrate, as illustrated in FIG. 3, the array substrate includes a plurality of pixel units 1 arranged in an array, a plurality of data lines 2 arranged in columns, and a plurality of first gate lines 3 and second gate lines 4 arranged in rows. Adjacent two columns of the pixel units 1 are collectively connected to one of the data line 2, and the data line 2 is positioned between the adjacent two columns of the pixel units 1 collectively connected to the data line 2. In each row of the pixel units 1, any adjacent two of the pixel units 1 are connected to the first gate line 3 and the second gate line 4, respectively. The first gate line 3 is disposed at a lower side of the row of pixel units 1, and the second gate line 4 is disposed at an upper side of the row of pixel units 1. Each of the pixel units 1 includes a transistor 11 and a pixel electrode 12, and the transistor in each of the pixel units is disposed adjacent to the data line to which the pixel unit is connected. In the two columns of pixel units 1 collectively connected to one of the data lines 2, the transistors 11 in two pixel units 1 respectively connected to the first gate line 3 and the second gate line 4 between adjacent two rows of the pixel units 1 are disposed diagonally, and at a position of the diagonally disposed transistors 11, each of the first gate line 3 and the second gate line 4 respectively surrounds the gate electrodes 111 of the transistors 11 of the pixel units 1 connected thereto, and the first gate line 3 and the second gate line 4 are connected to the gate electrodes 111 of the transistor 11 respectively at a position of the gate electrode 111 away from the data line 2.

According to above configuration, when a short circuit occurs between the gate electrodes 111 of two adjacent transistors 11 that are disposed diagonally (i.e., diagonally adjacent transistors 11) at a position across which the data line 2 passes, it is possible to cut off the short circuited gate electrode 111 from the first gate line 3 or the second gate line 4 at a position of the gate electrode 111 away from the data line 2 (hereinafter referred to "short circuit cut off"), thereby not only preventing the data line 2 from being cut off while repairing the short circuit, but also ensuring a normal driving of other pixel units 1 connected to the first and second gate lines 3 and 4 while cutting off the short circuit, thus ensuring a normal display of the array substrate while repairing the short circuit.

In some embodiments, each of the first gate line 3 and the second gate line 4 includes a plurality of first wiring segments 5 and a plurality of second wiring segments 6, the respective first wiring segments 5 extend in the row direction of the pixel units 1 and are interleaved in the row direction, gaps between the plurality of first wiring segments 5 are positioned at one side of the gate electrode 111 of each transistor 11. The second wiring segments 6 surround a periphery of sides of the gate electrode 111 of the transistor 11 other than the side corresponding to the first wiring segment 5, and the second wiring segments 6 are spaced apart from the gate electrode 111 of the transistor 11. The first wiring segment 5 is connected to the gate electrode 111 of the transistor 11 at one end thereof, both ends of the first wiring segment 5 are respectively connected to adjacent two of the second wiring segments 6, the first wiring segment 5 is connected to the gate electrode 111 of the transistor 11 at a first connection point 50. The end of the first wiring segment 5 that is connected to the gate electrode 111 of the transistor 11 is connected to the second wiring segment 6 at a second connection point 51, and the first connection point 50 is spaced apart from the second connection point 51 by a certain distance. According to such a configuration, when a short circuit occurs between the gate electrodes 111 of two diagonally adjacent transistors 11, it is possible to cut off the first wiring segment 5 connected to the short circuited gate electrode at the position of the first connection point 50 or a region between the first connection point 50 and the second connection point 51. A length of the certain distance is configured to ensure enough room to perform the short circuit cut off without cutting off the first wiring segment 5 and the second siring segment 6 outside the region of the certain distance.

The data line 2 is perpendicular to the first wiring segment 5, and the data line 2 and an orthogonal projection of the second wiring segment 6 on the array substrate intersect each other. According to such a configuration, when a short circuit occurs between the gate electrodes 111 of two diagonally adjacent transistors 11 at a position through which the data line 2 passes, it is unnecessary to perform repairing the short circuit cut off at the position through which the data line 2 passes, thereby reducing the difficulty of repairing the short circuit, and making the short circuit maintenance easy and fast. It should be noted that, the data line 2 and the second wiring segment 6 on the array substrate are insulatedly intersected with each other. That is, an insulation layer is interposed between the data line 2 and the second wiring segment 6.

In some embodiments, among adjacent two columns of the pixel units 1 collectively connected to one data line, the first connection point 50 on the first gate line 3 and the first connection point 50 on the second gate line 4 are respectively positioned at both sides of the data line 2 to which the adjacent two columns of the pixel units 1 are collectively connected, the second connection point 51 on the first gate line 3 and the second connection point 51 on the second gate line 4 are respectively positioned at both sides of the data line 2 to which the adjacent two columns of the pixel units 1 are collectively connected, the second connection point 51 on the first gate line 3 is positioned at a side of the first connection point 50 on the first gate line 3 away from the data line 2, and the second connection point 51 on the second gate line 4 is positioned at a side of the first connection point 50 on the second gate line 4 away from the data line 2. According to such a configuration, it is possible to perform the short circuit cut off on the first gate line 3 and the second gate line 4 respectively or simultaneously. Regardless of being performed respectively or simultaneously, the cut off on the first gate line 3 and that on the second gate line 4 may be performed without interference, thereby increasing the maintenance yield and maintenance efficiency.

In some embodiments, a shape of the second wiring segment 6 includes an unclosed rectangle. Of course, the shape of the second wiring segment 6 may also include an unclosed ring, an unclosed triangle or other unclosed shapes, as long as the second wiring segment 6 surrounds a periphery of sides of the gate electrode 111 of the transistor 11 other than the side where the gaps between the first wiring segments 5 are positioned.

In some embodiments, the transistor 11 surrounded by the second wiring segment 6 is close to a side of the pixel electrode 12 controlled by the transistor 11. According to such a configuration, while repairing a short circuit occurred between the gate electrodes 111 of diagonally adjacent transistors 11 in the array substrate, there will be enough maintenance room, thereby increasing the maintenance yield and maintenance efficiency.

In some embodiments, adjacent odd columns and even columns of the pixel units 1 are collectively connected to one of the data lines 2; and among each row of the pixel units 1, the odd columns of the pixel units 1 are connected to the first gate line 3, and the odd columns of the pixel units 1 are connected to the second gate line 4. The array substrate with dual-gate line configuration has a voltage linearity feature with greater range, thus it is possible to better control the problem of image quality degradation due to asymmetrical electrical signals, such that the array substrate may present images with higher quality.

It should be noted that, the first gate line 3 may also be connected to even columns of the pixel units 1 in each row of the pixel units 1. Correspondingly, the second gate line 4 is connected to odd columns of pixel units 1 in each row of the pixel units 1.

Figure 4:
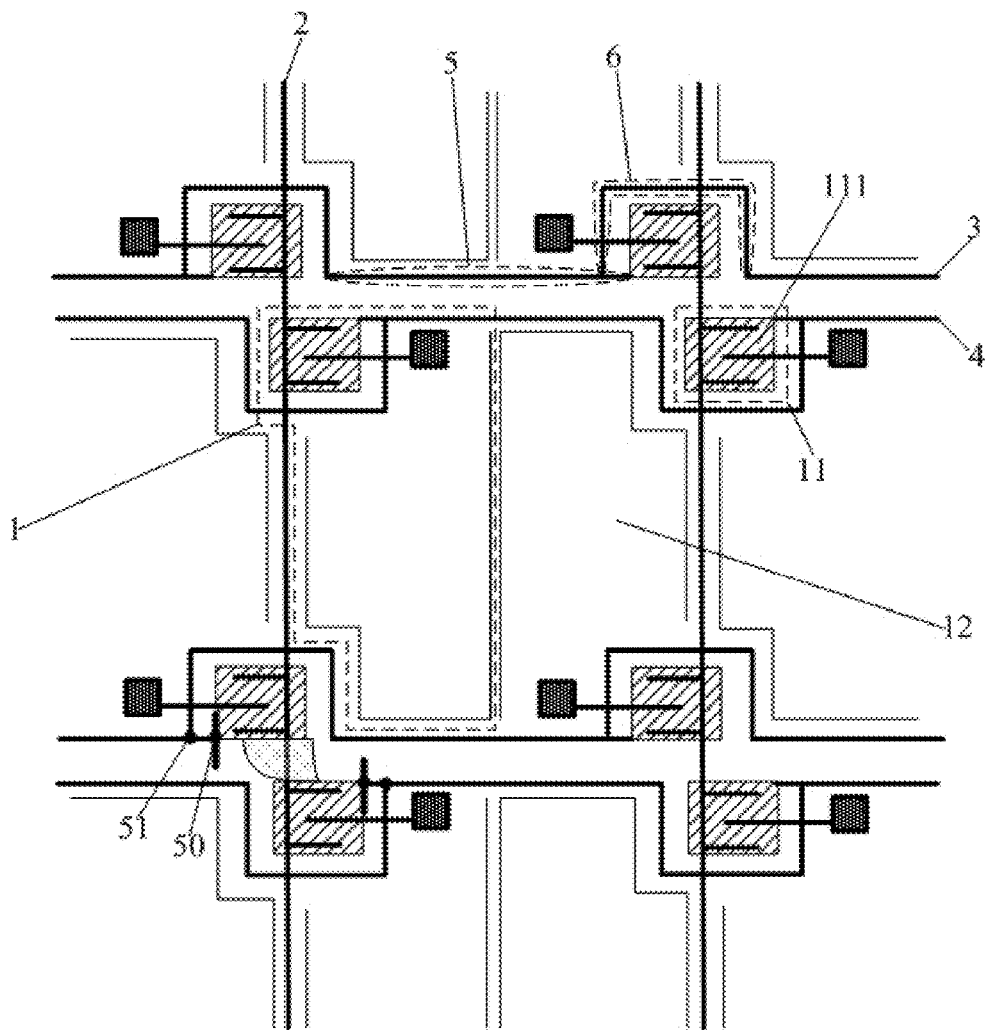
FIG. 4 is a schematic diagram illustrating a cutting off position when a short circuit occurs between gate electrodes of the transistors of two diagonally adjacent pixel units in the array substrate illustrated in FIG. 3.

Based on the above configuration of the array substrate, embodiments of the present disclosure further provide a method for maintaining the above array substrate. As illustrated in FIG. 4, the method includes: when a short circuit occurs between gate electrodes 111 of the two diagonally adjacent transistors 11, cutting off the connection between the first gate line 3 and the gate electrode 111 of the transistor 11; and cutting off the connection between the second gate line 4 and the gate electrode 111 of the transistor 11.

In some embodiments, when a short circuit occurs between gate electrodes 111 of the two diagonally adjacent transistors 11, the connection between the first gate line 3 and the gate electrode 111 of the transistor 11 is cut off at the first connection point 50 on the first gate line 3; and the connection between the second gate line 4 and the gate electrode 111 of the transistor 11 is cut off at the first connection point 50 on the second gate line 4.

It should be noted that, when a short circuit occurs between gate electrodes 111 of the two diagonally adjacent transistors 11, it is also possible to cut off the connection between the first gate line 3 and the gate electrode 111 of the transistor 11 only, or cut off the connection between the second gate line 4 and the gate electrode 111 of the transistor 11 only. Correspondingly, while cutting off the short circuit, it is possible to cut off the connection between the first gate line 3 and the gate electrode 111 of the transistor 11 at the first connection point 50 on the first gate line 3 only, or cut off the connection between the second gate line 4 and the gate electrode 111 of the transistor 11 at the first connection point 50 on the second gate line 4 only. By cutting off the short circuit in this way, it is also possible to repair the short circuit between gate electrodes 111 of the two diagonally adjacent transistors 11.

Figure 5:
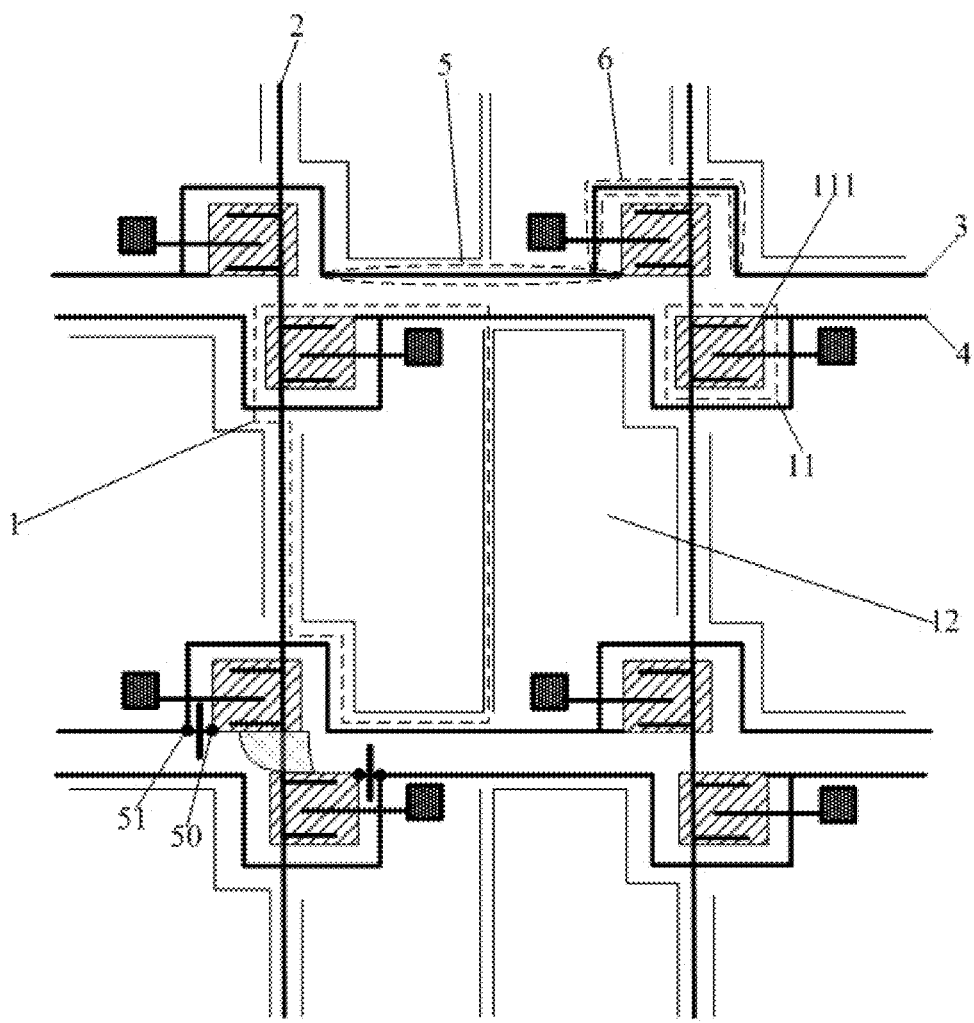
FIG. 5 is a schematic diagram illustrating another cutting off position when a short circuit occurs between gate electrodes of the transistors of two diagonally adjacent pixel units in the array substrate illustrated in FIG. 3.

It should be further noted that, as illustrated in FIG. 5, when a short circuit occurs between gate electrodes 111 of the two diagonally adjacent transistors 11, it is also possible to cut off the connection between the first gate line 3 and the gate electrode 111 of the transistor 11 at a position between the first connection point 50 and the second connection point 51 on the first gate line 3, and cut off the connection between the second gate line 4 and the gate electrode 111 of the transistor 11 at a position between the first connection point 50 and the second connection point 51 on the second gate line 4. Of course, it is also possible to cut off the connection between the first gate line 3 and the gate electrode 111 of the transistor 11 only, or cut off the connection between the second gate line 4 and the gate electrode 111 of the transistor 11 only. By cutting off the short circuit in this way, it is also possible to repair the short circuit between gate electrodes 111 of the two diagonally adjacent transistors 11.

According to another embodiment of the present disclosure, an array substrate includes: a first gate line 3 and a second gate line 4 adjacent to each other, extending in a first direction, and the first gate line 3 being positioned above the second gate line 4 in a second direction perpendicular to the first direction; a first pixel unit positioned above the first gate line 3 in the second direction and connected to the first gate line 3; a second pixel unit positioned below the second gate line 4 in the second direction and connected to the second gate line 4, and the first pixel unit and the second pixel unit being disposed diagonally; and a data line 2 extending in the second direction and positioned between the first pixel unit and the second pixel unit, the first pixel unit and the second pixel unit being collectively connected to the data line 2, wherein the first pixel unit includes a first transistor and a first pixel electrode, and the second pixel unit includes a second transistor and a second pixel electrode, and the first transistor and the second transistor are disposed adjacent to the data line 2, and the first and second transistors are respectively connected to the first gate line 3 and the second gate line 4 and are disposed diagonally, and at a position of the diagonally disposed transistors, the first gate line 3 surrounds the a gate electrode of the first transistor and is connected to the first gate electrode at a position of the first gate electrode away from the data line 2, and the second gate line 4 surrounds a second gate electrode of the second transistor and is connected to the second gate electrode at a position of the second gate electrode away from the data line 2.

In the array substrate provided in the embodiments of the present disclosure, at a position of the diagonally adjacent transistors, each of the first gate line and the second gate line respectively surrounds the gate electrode of the transistor, and the first gate line and the second gate line are respectively connected to the gate electrode of the transistor at a position of the gate electrode away from the data line. Accordingly, when a short circuit between the gate electrodes of the two diagonally adjacent transistors occurs at the position across which the data line passes, it is possible to cut off the short circuited portion between the first or second gate line and the electrode of the transistor at a position of the gate electrode away from the data line, thereby not only preventing the data line from being cut off while repairing the short circuit, but also ensuring a normal driving of other pixel units connected to the first and second gate lines while cutting off the short circuited portion, thus improving the maintenance yield and maintenance efficiency, and meanwhile ensuring a normal display of the array substrate while repairing the short circuit.

Embodiments of the present disclosure further provide a display panel including the array substrate according to the embodiments of the present disclosure.

By using the array substrate according to the embodiments of the present disclosure, it is able to increase the maintenance yield and maintenance efficiency when a short circuit between gate electrodes occurs in the display panel, and ensure a normal display of the display panel while repairing the short circuit.

Embodiments of the present disclosure further provide a display device including the display panel according to the embodiments of the present disclosure.

By using the display panel according to the embodiments of the present disclosure, it is able to increase the maintenance yield and maintenance efficiency when a short circuit between gate electrodes occurs in the display device, and ensure a normal display of the display device while repairing the short circuit.

The display device may be a mobile phone, a tablet, a TV set, a display, a notebook computer, a digital photo frame, a navigator or any products or components having a display function.

It should be appreciated that, the above embodiments are exemplary implementations for illustrating the principle of the present disclosure only, while the present disclosure is not limited thereto. Various modifications and improvements are possible to those ordinary skilled in the art without departing from the spirit and principle of the present disclosure. All these modifications and improvements will also fall into the protection scope of the present disclosure.

What is claimed is:

1. An array substrate comprising:
   a plurality of pixel units arranged in an array;
   a plurality of data lines arranged in columns; and
   a plurality of first gate lines and second gate lines arranged in rows, wherein:
   adjacent two columns of the pixel units are collectively connected to a data line of the plurality of data lines, and the data line is positioned between the adjacent two columns of the pixel units collectively connected to the data line;
   in each row of the pixel units, any adjacent two of the pixel units are connected to a first gate line of the plurality of first gate lines and a second gate line of the plurality of second gate lines, respectively, and the first gate line and the second gate line are disposed at an upper side and a lower side of the row of pixel units, respectively;
   each of the pixel units comprises a transistor and a pixel electrode, and the transistor in each of the pixel units is disposed adjacent to the data line to which the pixel unit is connected; and
   among the pixel units collectively connected to one of the data lines and positioned in adjacent two rows, the transistors of two pixel units respectively connected to the first gate line and the second gate line between the adjacent two rows of the pixel units are disposed diagonally, and at a position of the diagonally disposed transistors, each of the first gate line and the second gate line respectively surrounds gate electrodes of the transistors of the pixel units connected thereto, and the first gate line and the second gate line are connected to the gate electrodes of the transistor respectively at a position of the gate electrode away from the data line to which the transistors are connected,
   wherein each of the first gate line and the second gate line comprises a plurality of first wiring segments and a plurality of second wiring segments, respectively, the plurality of first wiring segments extend in a row direction of the pixel units and are interleaved in the row direction, gaps between the plurality of first wiring segments are positioned at one side of the gate electrode of each transistor, the second wiring segments surround a periphery of sides of the gate electrode of the transistor other than a side corresponding to the first wiring segment, and the second wiring segments are spaced apart from the gate electrode of the transistor; and
   the first wiring segment is connected to the gate electrode of the transistor at one end thereof, both ends of the first wiring segment are respectively connected to adjacent two of the second wiring segments, the first wiring segment is connected to the gate electrode of the transistor at a first connection point, an end of the first wiring segment that is connected to the gate electrode of the transistor is connected to the second wiring segment at a second connection point, and the first connection point is spaced apart from the second connection point by a certain distance.

2. The array substrate according to claim 1, wherein the data line is perpendicular to the first wiring segment, and the data line and an orthogonal projection of the second wiring segment on the array substrate intersect each other.

3. The array substrate according to claim 2, wherein among adjacent two columns of the pixel units collectively connected to one data line, the first connection point on the first gate line and the first connection point on the second gate line are respectively positioned at both sides of the data line to which the adjacent two columns of the pixel units are collectively connected, the second connection point on the first gate line and the second connection point on the second gate line are respectively positioned at both sides of the data line to which the adjacent two columns of the pixel units are collectively connected, the second connection point on the first gate line is positioned at a side of the first connection point on the first gate line away from the data line, and the second connection point on the second gate line is positioned at a side of the first connection point on the second gate line away from the data line.

4. The array substrate according to claim 3, wherein a shape of the second wiring segment comprises an unclosed rectangle or an unclosed ring.

5. The array substrate according to claim 4, wherein the second wiring segment surrounds a side of the transistor adjacent to the pixel electrode controlled by the transistor.

6. The array substrate according to claim 1, wherein adjacent odd columns or even columns of the pixel units are collectively connected to one of the data lines; and among each row of the pixel units, the odd columns of the pixel units are connected to the first gate line, and the even columns of the pixel units are connected to the second gate line.

7. A display panel comprising the array substrate according to claim 1.

8. A display device comprising a display panel, wherein the display panel comprises the array substrate according to claim 1.

9. A method for maintaining an array substrate, wherein the array substrate comprises:
 a plurality of pixel units arranged in an array;
 a plurality of data lines arranged in columns; and
 a plurality of first gate lines and second gate lines arranged in rows, wherein:
 adjacent two columns of the pixel units are collectively connected to a data line of the plurality of data lines, and the data line is positioned between the adjacent two columns of the pixel units collectively connected to the data line;
 in each row of the pixel units, any adjacent two of the pixel units are connected to a first gate line of the plurality of first gate lines and a second gate line of the plurality of second gate lines, respectively, and the first gate line and the second gate line are disposed at an upper side and a lower side of the row of pixel units, respectively;
 each of the pixel units comprises a transistor and a pixel electrode, and the transistor in each of the pixel units is disposed adjacent to the data line to which the pixel unit is connected; and
 among the pixel units collectively connected to one of the data lines and positioned in adjacent two rows, the transistors of two pixel units respectively connected to the first gate line and the second gate line between the adjacent two rows of the pixel units are disposed diagonally, and at a position of the diagonally disposed transistors, each of the first gate line and the second gate line respectively surrounds gate electrodes of the transistors of the pixel units connected thereto, and the first gate line and the second gate line are connected to the gate electrodes of the transistor respectively at a position of the gate electrode away from the data line to which the transistors are connected,
 wherein the method comprises:
 when a short circuit occurs between gate electrodes of the transistors that are disposed diagonally, cutting off a connection between the first gate line and the gate electrode of the transistor, cutting off a connection between the second gate line and the gate electrode of the transistor, or cutting off both the connection between the first gate line and the gate electrode of the transistor and the connection between the second gate line and the gate electrode of the transistor.

10. The method for maintaining the array substrate according to claim 9, further comprising:
 when the short circuit occurs between the gate electrodes of the transistors that are disposed diagonally, cutting off the connection between the first gate line and the gate electrode of the transistor at a first connection point on the first gate line, cutting off the connection between the second gate line and the gate electrode of the transistor at a first connection point on the second gate line, or cutting off both the connection between the first gate line and the gate electrode of the transistor at the first connection point on the first gate line and the connection between the second gate line and the gate electrode of the transistor at the first connection points on the second gate line.

11. The method for maintaining the array substrate according to claim 9, further comprising:
 when the short circuit occurs between the gate electrodes of the transistors that are disposed diagonally, cutting off the connection between the first gate line and the gate electrode of the transistor at a position between a first connection point and a second connection point on the first gate line, cutting off the connection between the second gate line and the gate electrode of the transistor at a position between a first connection point and a second connection point on the second gate line, or cutting off both the connection between the first gate line and the gate electrode of the transistor at a position between the first connection point and the second connection point on the first gate line and the connection between the second gate line and the gate electrode of the transistor at a position between the first connection point and the second connection point on the second gate line.

* * * * *